United States Patent
Hsiao et al.

(10) Patent No.: US 11,332,089 B2
(45) Date of Patent: May 17, 2022

(54) SUPPORTING ASSEMBLY

(71) Applicants: Inventec (Pudong) Technology Corporation, Shanghai (CN); INVENTEC CORPORATION, Taipei (TW)

(72) Inventors: Chi-Cheng Hsiao, Taipei (TW); Ying-Chao Peng, Taipei (TW); Chun-Ying Yang, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 17/019,661

(22) Filed: Sep. 14, 2020

(65) Prior Publication Data
US 2021/0380052 A1   Dec. 9, 2021

(30) Foreign Application Priority Data
Jun. 5, 2020   (CN) .......................... 202010507181.2

(51) Int. Cl.
*H05K 5/02* (2006.01)
*B60R 16/023* (2006.01)
*H05K 5/00* (2006.01)
*H05K 5/06* (2006.01)

(52) U.S. Cl.
CPC ....... *B60R 16/0239* (2013.01); *H05K 5/0008* (2013.01); *H05K 5/0204* (2013.01); *H05K 5/0247* (2013.01); *H05K 5/069* (2013.01)

(58) Field of Classification Search
CPC .................................................... H05K 5/0204
See application file for complete search history.

(56) References Cited

U.S. PATENT DOCUMENTS

| | | | | |
|---|---|---|---|---|
| 9,609,773 | B2* | 3/2017 | Blazic | H05K 7/02 |
| 2015/0047262 | A1* | 2/2015 | Lee | H05K 5/061 |
| | | | | 49/394 |
| 2015/0151504 | A1* | 6/2015 | Yang | G06F 1/1613 |
| | | | | 428/99 |
| 2017/0350469 | A1* | 12/2017 | Aro | F16F 15/022 |
| 2018/0183141 | A1* | 6/2018 | Newman | H05K 5/0039 |

* cited by examiner

*Primary Examiner* — Hung V Ngo
(74) *Attorney, Agent, or Firm* — Locke Lord LLP; Tim Tingkang Xia, Esq.

(57) ABSTRACT

A supporting assembly configured to fix a casing of an electronic device to a chassis and including a plate body, a cushioning component and a fastener. The plate body includes a mounting hole. The cushioning component is disposed through the mounting hole. The cushioning component includes a through hole. The fastener is disposed through the through hole of the cushioning component. A side of the fastener is configured to be fixed to the chassis, and the cushioning component is compressed by another side of the fastener and the chassis.

3 Claims, 5 Drawing Sheets

SUPPORTING ASSEMBLY

CROSS-REFERENCE TO RELATED APPLICATIONS

This non-provisional application claims priority under 35 U.S.C. § 119(a) on Patent Application No(s). 202010507181.2 filed in China, on Jun. 5, 2020, the entire contents of which are hereby incorporated by reference.

BACKGROUND OF THE INVENTION

Technical Field of the Invention

The invention relates to a supporting assembly, more particularly to a supporting assembly including a cushioning component.

Description of the Related Art

Travelling on uneven or bumpy road surfaces easily causes up-and-down vibrations to the vehicle. For the vehicles having an in-vehicle computer or server, such vibrations will be transmitted to the in-vehicle computer or server through the mount fixed thereto.

However, the typical mount for in-vehicle computer or server only has a limited ability to absorb such vibrations, and therefore is unable to effectively protect the in-vehicle computer or server from vibration damage.

SUMMARY OF THE INVENTION

The invention is to provide a supporting assembly capable of effectively reducing the vibrations transferred to the electronic device supported by the supporting assembly.

One embodiment of this invention provides a supporting assembly configured to fix a casing of an electronic device to a chassis and including a plate body, a cushioning component and a fastener. The plate body includes a mounting hole. The cushioning component is disposed through the mounting hole. The cushioning component includes a through hole. The fastener is disposed through the through hole of the cushioning component. A side of the fastener is configured to be fixed to the chassis, and the cushioning component is compressed by another side of the fastener and the chassis.

Another embodiment of this invention provides a supporting assembly configured to fixed a casing of an electronic device to a chassis and including a plate body, a cushioning component, a positioning pillar and a fastener. The plate body includes a mounting hole. The cushioning component is disposed through the mounting hole. The cushioning component includes a through hole. The positioning pillar is disposed through the through hole of the cushioning component and the chassis. The positioning pillar is configured to fix the casing of the electronic device to the chassis via the plate body. The fastener is fastened in the positioning pillar, and the positioning pillar is clamped by a side of the fastener and the chassis so that the cushioning component is compressed.

According to the supporting assembly disclosed by the above embodiments, the plate body of the supporting assembly is fixed to the casing of the electronic device via the cushioning component and the fastener while the cushioning component is compressed between the casing and the fastener. Thus, the cushioning component can effectively absorb the vibrations transferred to the fastener from the casing of the electronic device. As a result, the vibrations transferred to the casing of the electronic device can be effectively mitigated.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

Figure 1:
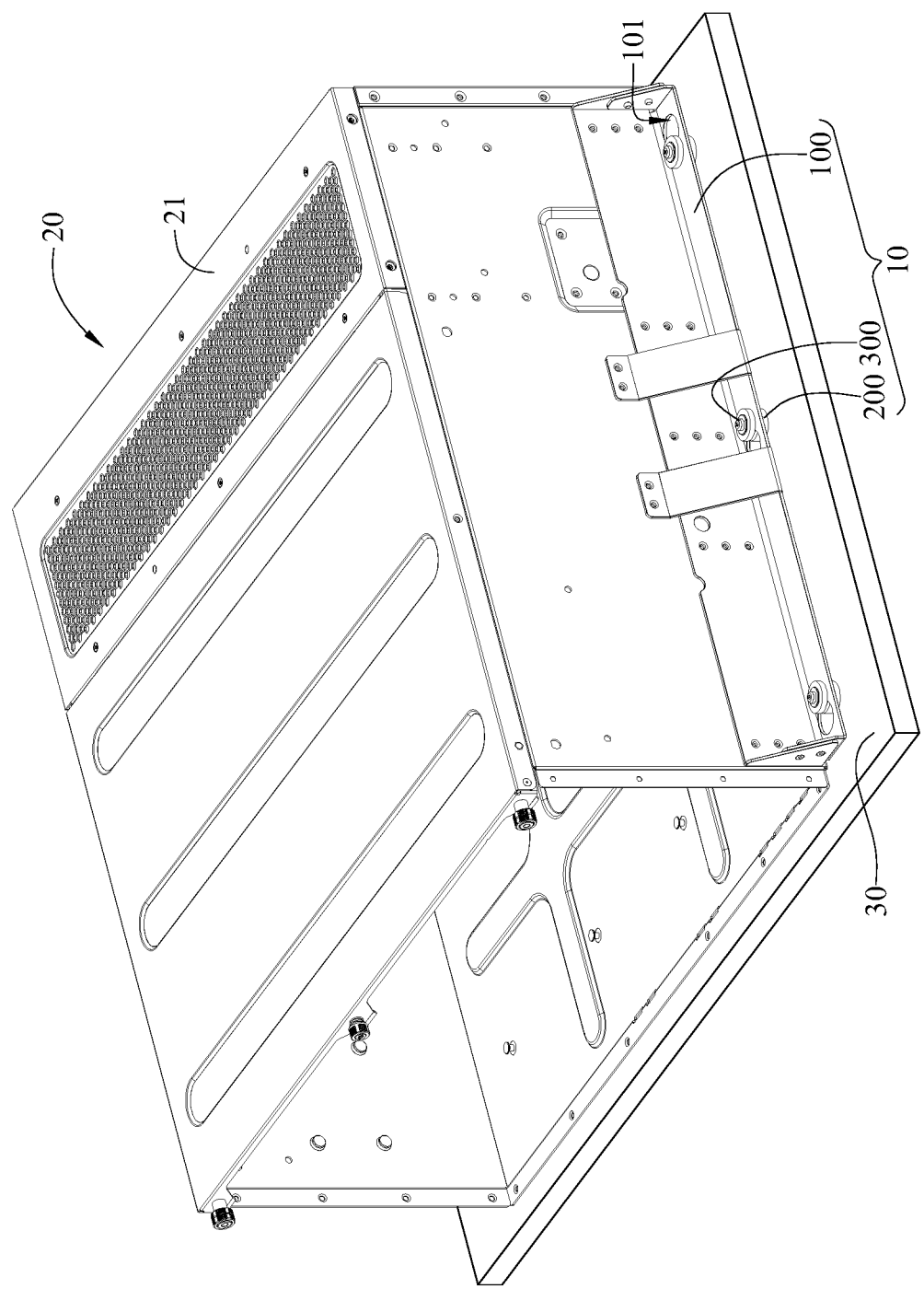
FIG. 1 is a perspective view showing that a casing of an electronic device is mounted on a supporting assembly according to a first embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
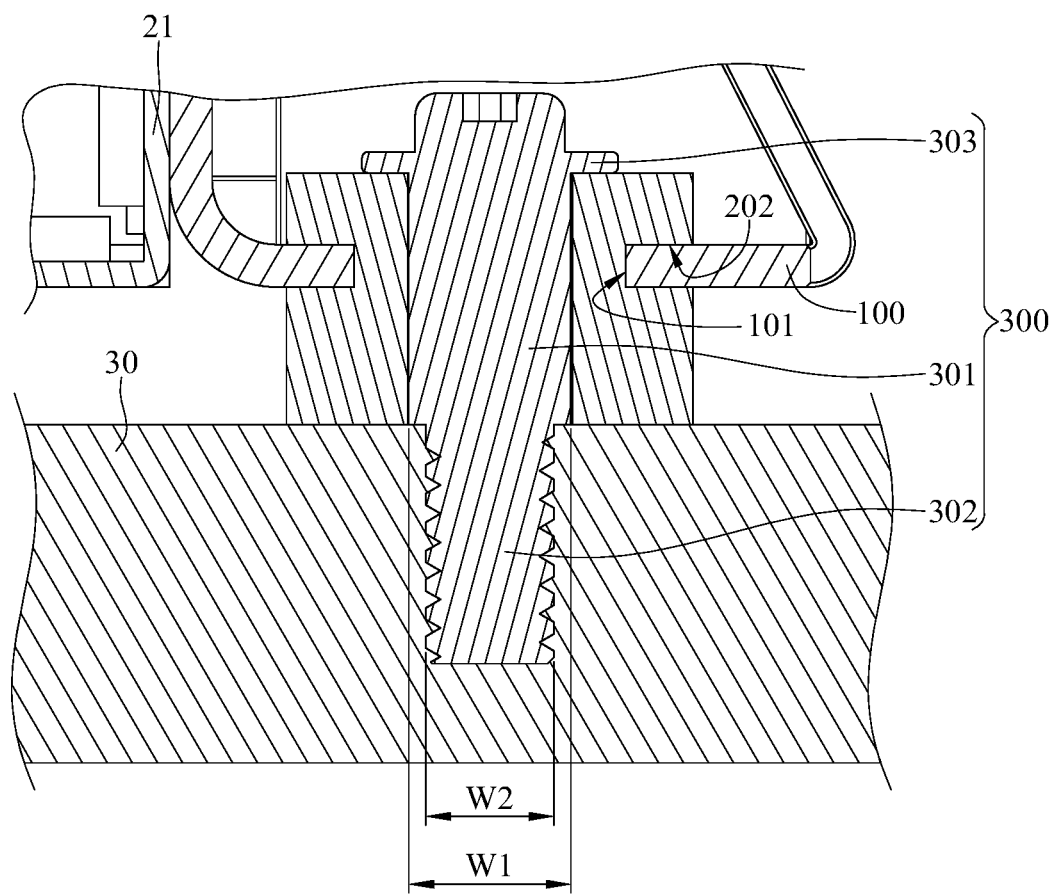
FIG. 2 is a partially enlarged side cross-sectional view of the supporting assembly and the casing of the electronic device in FIG. 1.
Figure 3:
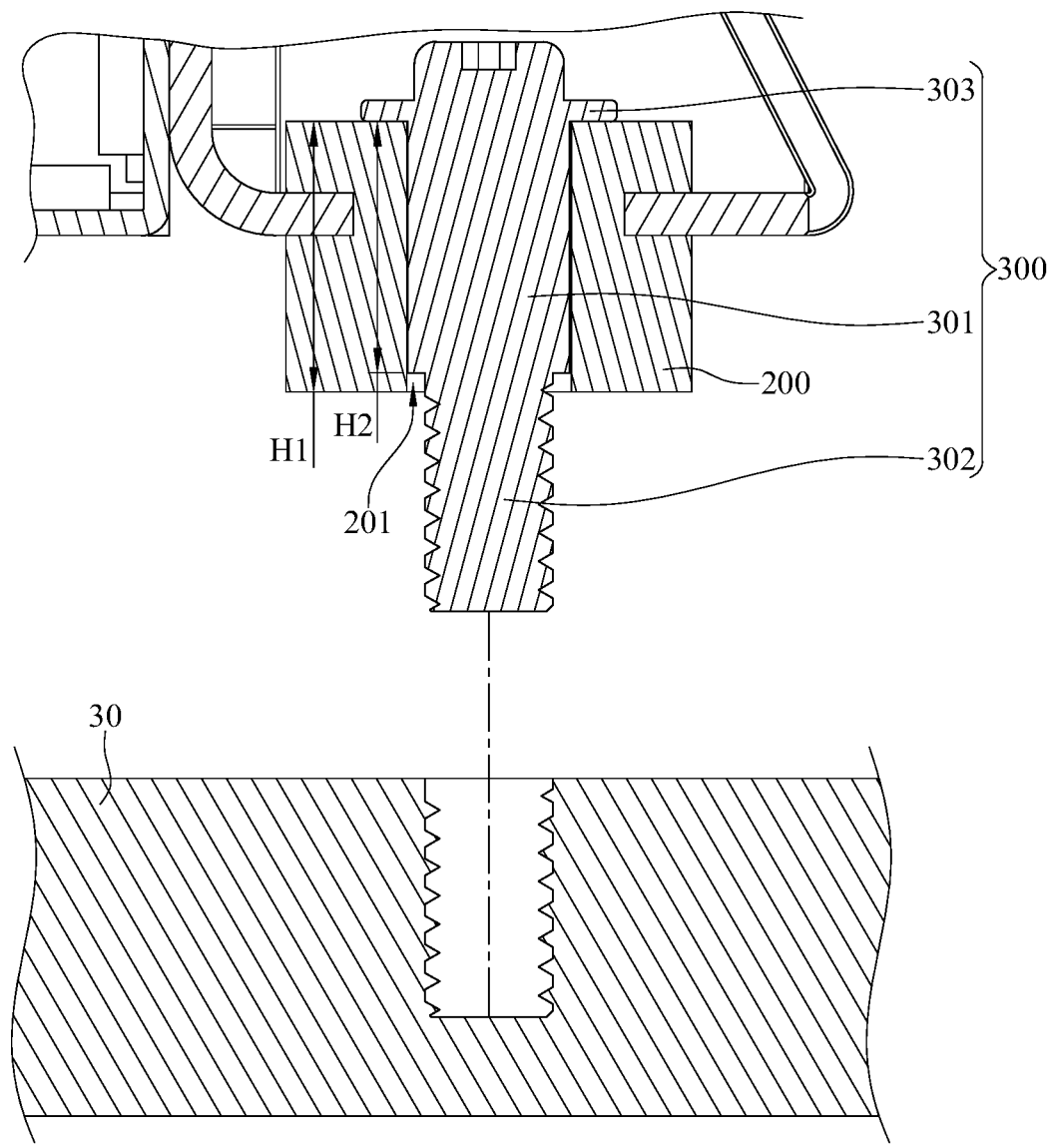
FIG. 3 is a side cross-sectional view showing that a cushioning component of the supporting assembly in FIG. 2 is not deformed.

Please refer to FIG. 1 to FIG. 3, where FIG. 1 is a perspective view showing that a casing 21 of an electronic device 20 is mounted on a supporting assembly 10 according to a first embodiment of the invention, FIG. 2 is a partially enlarged side cross-sectional view of the supporting assembly 10 and the casing 21 of the electronic device 20 in FIG. 1, and FIG. 3 is a side cross-sectional view showing that a cushioning component 200 of the supporting assembly 10 in FIG. 2 is not deformed.

The supporting assembly 10 is configured to be mounted on a side of the casing 21 of the electronic device 20 so as to fix the casing 21 to a chassis 30; in other words, the supporting assembly 10 is configured for installing the electronic device 20 to the chassis 30. In this embodiment, the supporting assembly 10 includes a plate body 100, a plurality of cushioning components 200, and a plurality of fasteners 300. In this embodiment, the electronic device 20 is, for example, an automotive computer or an in-vehicle computer, and the chassis 30 is disposed in, for example, a rear compartment of a vehicle. The plate body 100 includes a plurality of mounting holes 101 and is fixed to the side of the casing 21 of the electronic device 20.

Please refer to FIG. 2 and FIG. 3, the cushioning component 200 is disposed through the mounting hole 101 and includes a through hole 201 and a slot 202. The slot 202 is spaced apart from the through hole 201; in other words, the slot 202 does not directly connect to the through hole 201. The plate body 100 is engaged with the slot 202 so as to fix the cushioning component 200 in position; in other words, part of the plate body 100 is embedded into the slot 202 so as to secure the position of the cushioning component 200.

Note that the slot 202 is optional and not intended to limit the invention. In other embodiments, the cushioning component may omit the above slot 202; in such a case, the cushioning component and the edge of the through hole of the plate body may be in a tight fit or a press fit.

The fastener 300 is, for example, a step screw and includes a neck part 301, a threaded part 302, and a flange part 303 that are integrally formed as a single piece. The neck part 301 and the threaded part 302 are connected to each other. A width W1 of the neck part 301 is greater than a width W2 of the threaded part 302. The flange part 303 radially protrudes outward from the end of the neck part 301 that is located away from the threaded part 302. The neck part 301 is disposed through the through hole 201 of the cushioning component 200. The threaded part 302 is screwed into the chassis 30. The cushioning component 200 is clamped by the flange part 303 and the chassis 30 and therefore is held in position.

In addition, as shown in FIG. 2 and FIG. 3, in this embodiment, when no external force is applied to the cushioning component 200, the cushioning component 200 has an original length H1, the neck part 301 has an engagement length H2 between the flange part 303 and the threaded part 302, and the original length H1 is greater than the engagement length H2. In this embodiment, the difference between the original length H1 and the engagement length H2 is substantially 7% of the engagement length H2. In this embodiment, the original length H1 of the cushioning component 200 is, for example, 12.7 mm, and the engagement length H2 of the neck part 301 of the fastener 300 is, for example, 11.8 mm.

As shown in FIG. 2, when the fastener 300 is mounted on the plate body 100, the cushioning component 200 is compressed by the flange part 303 of the fastener 300 and the chassis 30. At this moment, the length of the cushioning component 200 is decreased to be equal to the engagement length H2 of the neck part 301, such that the cushioning component 200 is able to further mitigate the vibrations transferred to the casing 21 of the electronic device 20.

For example, in a shelf vibration test, when both of the real set up and the testing set up are in a case that the supporting assembly 10 bears a weight of 16 kilograms and includes four cushioning components 200, the first peak value is generated on 23 Hz and the acceleration loading is 2.49 times larger than the gravitational acceleration. When the real set up is in a case that the supporting assembly 10 bears a weight of 16 kilograms and includes six cushioning components 200 and the testing set up is in a case that the supporting assembly 10 bears a weight of 10.7 kilograms and includes four cushioning components 200, the first peak value is generated on 29 Hz and the acceleration loading is 2.95 times larger than the gravitational acceleration.

Note that the length of the cushioning component can be compressed is not intended to limit the invention. In other embodiments, the difference between the original length of the cushioning component and the engagement length of the neck part of the fastener may be greater or smaller than 7% of the engagement length.

The number of the supporting assembly 10 for installing the electronic device 20 is not limited to be one. In other embodiments, the casing 21 of the electronic device 20 may be installed in position via two supporting assemblies 10 arranged on two opposite sides thereof.

Figure 4:
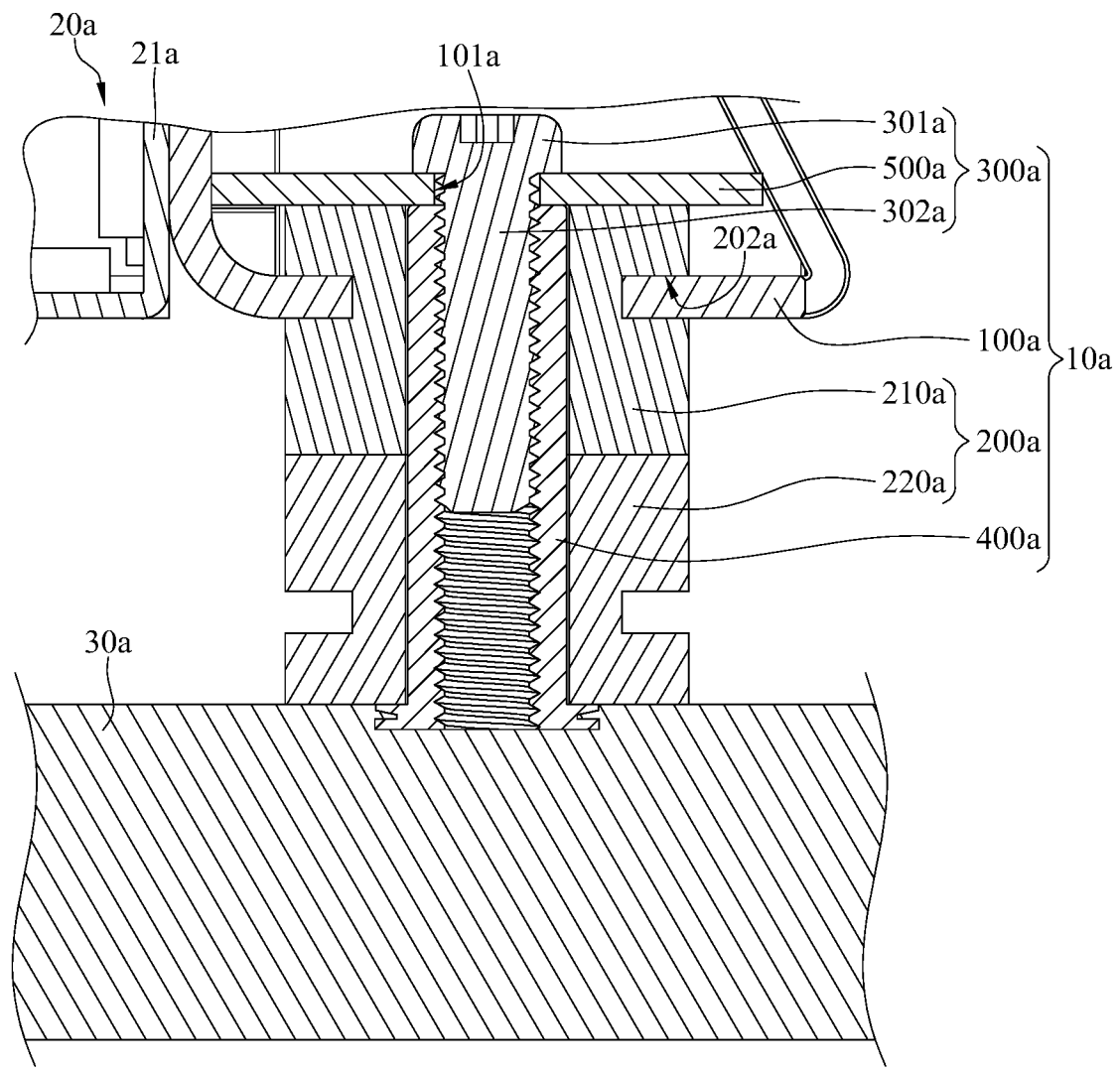
FIG. 4 is a partially enlarged side cross-sectional view of a supporting assembly according to a second embodiment and a casing of an electronic device.
Figure 5:
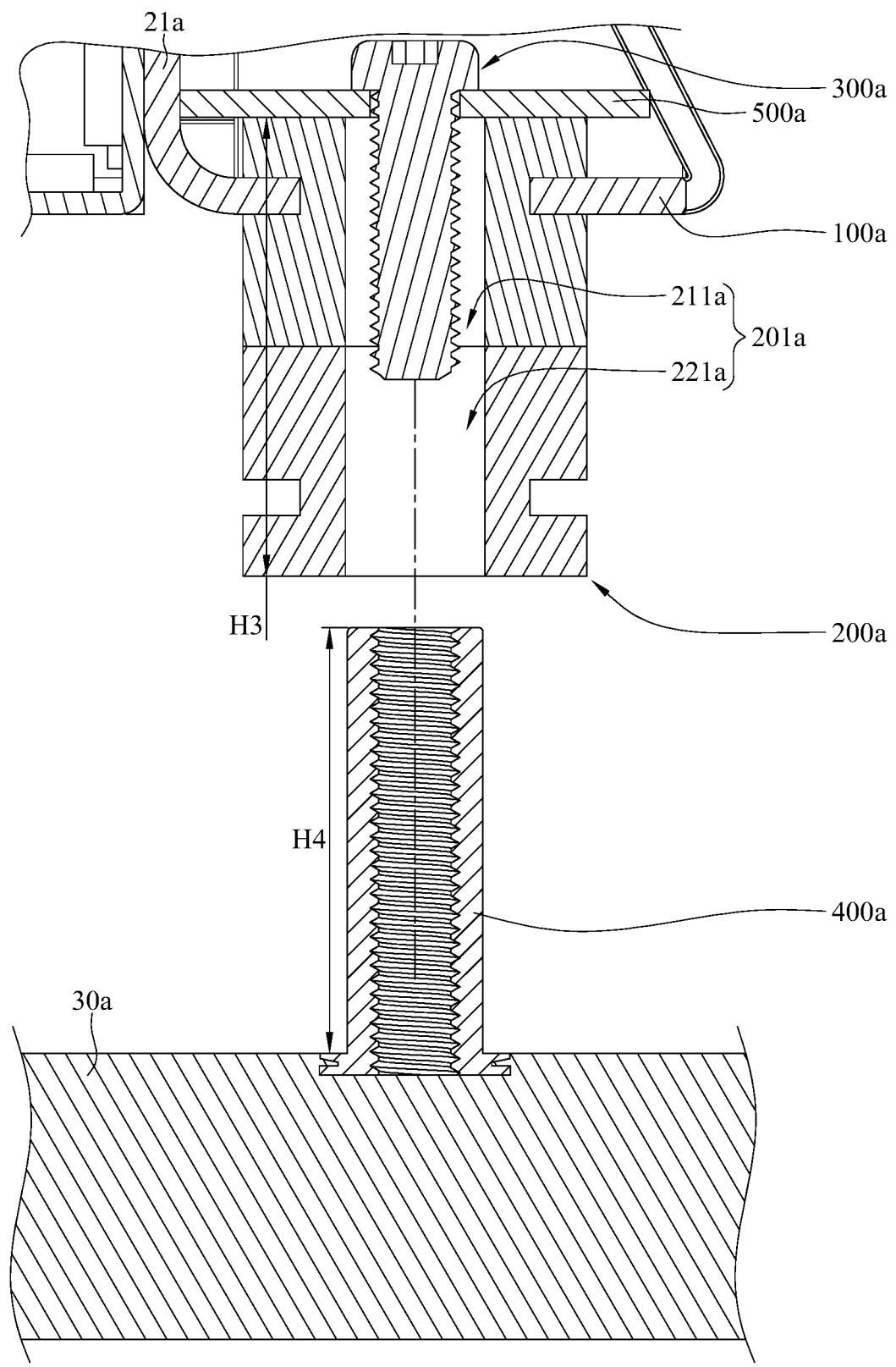
FIG. 5 is a side cross-sectional view showing that a cushioning component of the supporting assembly in FIG. 4 is not deformed.

Note that the above configuration of the cushioning component 200 and connection between the cushioning component 200 and the chassis 30 are exemplary and not intended to limit the invention. For example, please refer to FIG. 4 and FIG. 5, where FIG. 4 is a partially enlarged side cross-sectional view of a supporting assembly 10a according to a second embodiment and a casing 21a of an electronic device 20a, and FIG. 5 is a side cross-sectional view showing that a cushioning component 200a of the supporting assembly 10a in FIG. 4 is not deformed.

In this embodiment, the supporting assembly 10a includes a plate body 100a, the cushioning component 200a, a positioning pillar 400a and a fastener 300a. The plate body 100a includes a mounting hole 101a and is configured to be fixed to the casing 21a of the electronic device 20a.

In this embodiment, the cushioning component 200a is a two-piece structure. In detail, the cushioning component 200a includes a first cushioning component 210a and a second cushioning component 220a. The first cushioning component 210a includes a first through hole 211a, the second cushioning component 220a includes a second through hole 221a, and the first through hole 211a and the second through hole 221a together form a through hole 201a. The first cushioning component 210a is clamped by the plate body 100a and the second cushioning component 220a. The second cushioning component 220a is clamped by the first cushioning component 210a and a chassis 30a. In other words, the cushioning component 200a provided by this embodiment is formed by assembling multiple pieces, but the invention is not limited thereto. In other embodiments, the cushioning component may be formed as a single piece.

In addition, the first cushioning component 210a includes a slot 202a. The slot 202a is spaced apart from the through hole 201a and the plate body 100a is engaged with the slot 202a.

However, the first cushioning component 210a is not limited to include the slot 202a, and this is to say that the two-piece cushioning component 200a is not limited to include the slot 202a. In other embodiments, the first cushioning component may not include the slot 202a; in such a case, the cushioning component and the edge of the through hole of the plate body may be in a tight fit or a press fit.

In addition, in this embodiment, a shape of the first cushioning component 210a is substantially the same as a shape of the second cushioning component 220a. In this way, the first cushioning component 210a and the second cushioning component 220a are allowed to be manufactured by the same mold, thereby reducing the manufacture cost of the cushioning component 200a. However, the shape of the first cushioning component 210a is not limited to be substantially the same as the shape of the second cushioning component 220a. In other embodiments, the shape of the first cushioning component may be different from the shape of the second cushioning component.

The positioning pillar 400a is disposed through the through hole 201a and the chassis 30a so as to fix the casing 21a of the electronic device 20a to the chassis 30a via the plate body 100a.

The fastener 300a includes a head part 301a, a neck part 302a and a flange part 500a that are connected to one another. The neck part 302a is screwed into the positioning pillar 400a. The flange part 500a radially protrudes outwards from the neck part 302a. Also, the flange part 500a and the neck part 302a are multiple pieces that assembled together. In other words, the flange part 500a is a pad for assembling the neck part 302a. The flange part 500a is clamped by the head part 301a and the positioning pillar 400a. The cushioning component 200a is clamped by the flange part 500a and the chassis 30a and therefore is held in position.

However, the cushioning component 200a is not limited to be a two-piece structure. That is, the cushioning component is not limited to include the first cushioning component and the second cushioning component. In the embodiments where the cushioning component is fixed to the casing of the electronic device via the positioning pillar and the fastener, the cushioning component may be a single-piece structure.

In addition, please refer to FIG. 5 that is a side cross-sectional view showing that a cushioning component of the supporting assembly in FIG. 4 is not deformed. In this embodiment, when no external force is applied to the cushioning component 200a, the cushioning component 200a has an original length H3. The original length H3 is greater than a protruding length H4 by which the positioning pillar 400a protrudes from the chassis 30a to the flange part 500a, and the difference between the original length H3 and the protruding length H4 is substantially 7% of the protruding length H4.

For example, in a shelf vibration test, when both of the real set up and the testing set up are in a case that the supporting assembly 10a bears a weight of 16 kilograms and includes four cushioning components 200a, the first peak value is generated on 14 Hz and the acceleration loading is 2.31 times larger than the gravitational acceleration. When the real set up is in a case that the supporting assembly 10a bears a weight of 16 kilograms and includes six cushioning components 200a and the testing set up is in a case that the supporting assembly 10a bears a weight of 10.7 kilograms and includes four cushioning components 200a, the first peak value is generated on 21 Hz and the acceleration loading is 2.92 times larger than the gravitational acceleration.

Note that the length of the cushioning component 200a can be compressed is not limited and not intended to limit the invention. In other embodiments, the difference between the original length of the cushioning component and the protruding length of the positioning pillar may be greater or smaller than 7% of the protruding length.

According to the supporting assembly disclosed by the above embodiments, the plate body of the supporting assembly is fixed to the casing of the electronic device via the cushioning component and the fastener while the cushioning component is compressed between the casing and the fastener. Thus, the cushioning component can effectively absorb the vibrations transferred to the fastener from the casing of the electronic device. As a result, the vibrations transferred to the casing of the electronic device can be effectively mitigated.

In addition, the plate body is fixed to the casing of the electronic device via the cushioning component, the positioning pillar and the fastener while the cushioning component is compressed between the casing and the fastener. Thus, the cushioning component can effectively absorb the vibrations transferred to the fastener and the positioning pillar from the casing of the electronic device. As a result, the vibrations transferred to the casing of the electronic device can be effectively mitigated.

In an embodiment of the invention, the technique disclosed by the invention can be applied to vehicles, such as autonomous vehicles (AV), electric vehicles, or a vehicle equipped with an advanced driver assistance systems (ADAS).

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. A supporting assembly, configured to fixed a casing of an electronic device to a chassis, the supporting assembly comprising:
    a plate body, comprising a mounting hole;
    a cushioning component, disposed through the mounting hole, the cushioning component comprising a through hole;
    a positioning pillar, disposed through the through hole of the cushioning component and the chassis, the positioning pillar configured to fix the casing of the electronic device to the chassis via the plate body; and
    a fastener, fastened in the positioning pillar, and the positioning pillar clamped by a side of the fastener and the chassis so that the cushioning component is compressed;
    wherein the fastener comprises a head part, a neck part and a flange part, the head part and the neck part are connected to each other, the flange part radially protrudes from the neck part, the flange part and the neck part are multiple pieces that are assembled together, the neck part is screwed into the positioning pillar, the flange part is clamped by the head part and the positioning pillar, and the cushioning component is clamped by the flange part and the chassis;
    wherein when the cushioning component is not compressed, the cushioning component has an original length, and the original length is greater than a protruding length by which the positioning pillar protrudes from the chassis to the flange part; and
    a difference between the original length and the protruding length is 7% of the protruding length.

2. The supporting assembly according to claim 1, wherein the cushioning component further comprises a slot, the slot spaced apart from the through hole, and the plate body engaged with the slot.

3. The supporting assembly according to claim 1, wherein the cushioning component comprises a first cushioning component and a second cushioning component, the first cushioning component is clamped by the plate body and the second cushioning component, the second cushioning component is configured to be clamped by the first cushioning component and the chassis, the first cushioning component comprises a first through hole, the second cushioning component comprises a second through hole, and the first through hole and the second through hole together form the through hole.

* * * * *